(12) United States Patent
Hotta et al.

(10) Patent No.: US 6,563,057 B2
(45) Date of Patent: *May 13, 2003

(54) PRINTED CIRCUIT BOARD AND METHOD FOR MANUFACTURING SAME

(75) Inventors: Sinichi Hotta, Toyama (JP); Hisaya Takahashi, Toyama (JP)

(73) Assignee: NEC Toppan Circuit Solutions, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/501,296

(22) Filed: Feb. 9, 2000

(65) Prior Publication Data

US 2002/0112885 A1 Aug. 22, 2002

(30) Foreign Application Priority Data

Feb. 10, 1999 (JP) ............................................. 11-032908

(51) Int. Cl.⁷ .................................................. H05K 1/11
(52) U.S. Cl. ....................... 174/262; 174/261; 174/264; 361/792
(58) Field of Search ................................ 174/260, 261, 174/262, 263, 264, 265, 266; 361/792, 793, 794, 795

(56) References Cited

U.S. PATENT DOCUMENTS

| 4,729,061 A | * | 3/1988 | Brown ....................... 174/16.3 |
| 4,795,670 A | * | 1/1989 | Nishigaki et al. ............ 428/209 |
| 5,219,639 A | * | 6/1993 | Sugawara et al. ........... 428/209 |
| 5,315,072 A | * | 5/1994 | Arai et al. .................... 174/262 |
| 5,473,120 A | * | 12/1995 | Ito et al. ...................... 174/255 |
| 5,699,613 A | * | 12/1997 | Chong et al. ................ 174/264 |
| 5,745,984 A | * | 5/1998 | Cole, Jr. et al. .............. 29/834 |
| 5,847,326 A | * | 12/1998 | Kawakami et al. .......... 174/256 |
| 5,958,600 A | * | 9/1999 | Sotokawa et al. ........... 428/458 |
| 6,124,553 A | * | 9/2000 | Narizuka et al. ............ 174/260 |
| 6,198,635 B1 | * | 3/2001 | Shenoy et al. ............... 361/760 |
| 6,236,572 B1 | * | 5/2001 | Teshome et al. ............. 361/794 |
| 6,316,738 B1 | * | 11/2001 | Mori et al. .................. 174/261 |

FOREIGN PATENT DOCUMENTS

| JP | 54-109168 | 8/1979 |
| JP | 63-312658 | 12/1988 |
| JP | 1-144653 | 6/1989 |
| JP | 2-188992 | 7/1990 |
| JP | 3-136244 | 6/1991 |
| JP | 6-77331 | 3/1994 |
| JP | 6-275950 | 9/1994 |
| JP | 6-345981 | 12/1994 |
| JP | 10-214832 | 8/1998 |

* cited by examiner

Primary Examiner—Albert W. Paladini
Assistant Examiner—José H. Alcalá
(74) Attorney, Agent, or Firm—McGinn & Gibb, PLLC

(57) ABSTRACT

In a multilayer printed circuit board having a conductor pattern, covered with an insulation layer having via holes, these via holes are filled with a conductor by means of electroless nickel plating or electroless copper plating.

8 Claims, 4 Drawing Sheets

PRINTED CIRCUIT BOARD AND METHOD FOR MANUFACTURING SAME

BACKGROUND OF THE INVENTION

1. Field of the Invention

The present invention relates to a multilayer printed circuit board and method for manufacturing such a printed circuit board, and more particularly to a method for forming a high-density conductive circuit onto a multilayer printed circuit board, to a structure of a contact hole for connecting an upper wiring layer with a lower wiring layer, and to a method for manufacturing same.

2. Background of the Invention

A method of manufacturing a printed circuit board in the prior art is described below, with reference make to FIG. 3 and FIG. 4.

In a multilayer printed circuit board of the past, via holes are provided in an insulating board or insulating layer and a copper layer is formed on the outer surface of the insulating board or the insulating layer and inside the via holes, so as to make an electrical connection to a lower wiring layer.

The method of forming the printed circuit board wiring pattern can be divided into two general types. The first type, known as the subtractive method, is illustrated in cross-section form in FIG. 3. First, as shown in FIG. 3(a), a known method is used to manufacture a board 1, which is fabricated as a fiberglass-based epoxy resin laminate and will serve as the core of the multilayer printed circuit board. In this board 1, a hole 2 filled with resin and an internal layer circuit 3 are formed. Then, as shown in FIG. 3(b), an insulation layer 4 having a thickness of 40 to 80 $\mu$m is formed onto the surface of the board 1 using, for example, the curtain coating method. Next, as shown in FIG. 3(c), a photolithography process or $CO_2$ laser is used to form a via hole 5 having a diameter of 50 to 80 $\mu$m at required locations in the insulation layer 4.

Next, as shown in FIG. 3(d), an electrically conductive layer is formed on the surface of the insulation layer 4 by means of electroless copper plating, this electrical plating being done to a required thickness. Then, as shown in FIG. 3(e), etching resist is formed, which is then used to perform etching of the copper to obtain a conductive circuit, as shown in FIG. 3(f). Otherwise after an electrical conductive layer is formed, plating resist is formed in the negative image of the conductive circuit and electrical plating is done to the required thickness, after which the plating resist is peeled away, so as to form conductive circuits by means of quick-etching of the above-noted conductive layer. In this method, the pattern accuracy is determined by the resist resolution and the accuracy of the etching.

The second method is the additive method, which is illustrated in cross-section form in FIG. 4. First, as shown in FIG. 4(a), a known method is used to manufacture a board 1, which is fabricated as a fiberglass-based epoxy resin laminate and will serve as the core of the multilayer printed circuit board. In this board 1, a hole 2 filled with resin and an internal layer circuit 3 are formed. Then, as shown in FIG. 4(b), an insulation layer 4 having a thickness of 40 to 80 $\mu$m is formed onto the surface of the board 1 using, for example, the curtain coating method. Next, as shown in FIG. 4(c), a photolithography process or $CO_2$ laser is used to form a via hole 5 having a diameter of 50 to 80 $\mu$m at required locations in the insulation layer 4.

Next, as shown in FIG. 4(d) and FIG. 4(e), an insulation material to which a catalyst has been added, is formed or a catalyst is added to the surface of the insulation layer 4 and the surface of non-conductive pattern part is covered with a plating resist, after which, as shown in FIG. 4(f), selective copper plating is done so as to form the conductive pattern.

In the additive method, because the etching process step is not necessary and the pattern accuracy is determined by just the accuracy of the photosensitive resist and screen printed ink, it is possible to produce as fine a pattern as will be allowed by the resist resolution.

The above-described printed circuit board structure has the following problems.

Firstly, although the via holes of the multilayer printed circuit board have a conductor on their side walls, because the insides of the via holes are filled with resin, it is not possible to form the other via hole to make an electrical connection to a lower wiring layer or an upper wiring layer, on one via hole, this representing a hindrance in making wiring connections.

Another problem is that, with the method used in the past to fabricate a multilayer printed circuit board, there was poor plating attachment to a via hole formed in the multilayer printed circuit board, thereby lowering the reliability of connections.

Yet another problem was that, with a multilayer printed circuit board of the past, the inside of a via hole is filled with resin, thereby causing a worsening of coplanarity at the resin part, this causing a problem with microfine wiring on the via hole.

Yet another problem was that, with a multilayer printed circuit board of the past, there is generally poor adhesion between the copper plating and the insulating resin material.

Yet another problem was that, when using a via hole of a multilayer printed circuit board as a mounting pad, solder is taken into the via hole, as shown in FIG. 3, so that the amount of solder is not constant, thereby making it necessary to provide a separate pad.

The present invention uses additive plating resist and electroless nickel plating in a multilayer printed circuit board, the inside of a via hole being filled with electroless nickel plating, so as to form a flat surface without a hollow part, thereby forming a high-density circuit not possible in the past. This removes the pattern design restriction imposed by the via hole, and enables the achievement of a printed circuit board with a high component mounting density, and high connection reliability.

SUMMARY OF THE INVENTION

In order to achieve the above-noted objects, the present invention has the following basic technical constitution.

The first aspect of the present invention is a multilayer printed circuit board comprising: an insulating board on which an electrical conductive pattern is formed, an insulation layer formed on the insulating board, and a via hole formed in the insulation layer, wherein the via hole is filled with a conductor formed by electroless nickel plating or electroless copper plating.

The second aspect of the present invention is a multilayer printed circuit board comprising: an insulating board on which an electrical conductive pattern is formed, an insulation layer formed on the insulating board, and a via hole formed in the insulation layer, a conductive circuit layer formed on the insulation layer, wherein the via hole and the conductive circuit layer are made of nickel or copper and the insulation layer having the via hole and the conductive circuit layer are formed alternately.

In the third aspect of the present invention, a plating resist as well as the conductive circuit layer is provided on the insulation layer.

The forth aspect of the present invention is a method for manufacturing a multilayer printed circuit board, the multilayer printed circuit board comprising: an insulating board on which an electrical conductive pattern is formed, an insulation layer formed on the insulating board, and a via hole formed in the insulation layer, wherein the via hole is filled with a conductor formed by electroless nickel plating or electroless copper plating.

The fifth aspect of the present invention is a method for manufacturing a multilayer printed circuit board, the multilayer printed circuit board comprising: an insulating board on which an electrical conductive pattern is formed, an insulation layer formed on the insulating board, and a via hole formed in the insulation layer, a conductive circuit layer formed on the insulation layer, wherein the via hole and the conductive circuit layer are formed by electroless nickel plating or electroless copper plating.

The sixth aspect of the present invention is a method for manufacturing a multilayer printed circuit board comprising the steps of: a first step of an insulation board with an electrical conductive pattern, a second step of forming an insulation layer over the insulation board, a third step of forming a via hole in the insulation layer, a forth step of filling an inside of the via hole with nickel or copper, using an electroless plating, a fifth step of flattening a surface of the insulation layer and the via hole, a sixth step of forming a surface plating over the via hole, a seventh step of imparting a catalyst to an entire surface of the insulation layer and the via hole, a eighth step of forming a plating resist on the insulation layer, a ninth step of forming an electrical conductive pattern on the insulation layer, using an electroless nickel plating or an electroless copper plating, and a tenth step of forming a surface plating over the electrical conductive pattern formed on the ninth step.

The seventh aspect of the present invention is a method for manufacturing a multilayer printed circuit board including a eleventh step of forming a multilayer structure, by repeating a required number of times from the second step to the tenth step.

The present invention using electroless nickel plating as a filling metal for the via holes and, by doing so, achieves the following effects.

Firstly, because of electroless plating, it is possible to plate over the entire exposed part of the base metal, and it is not necessary to provide an electrical connection circuit and perform etching after plating, which are essential if electrolytic plating is done, thereby simplifying the process.

Another effect is that, in comparison with electroless copper plating, electroless nickel plating provides deposition at a higher rate, enabling processing in a shorter time. Additionally, electroless nickel plating has weak acidic nature.

DESCRIPTION OF THE PREFERRED EMBODIMENTS

Embodiments of the present invention are described in detail below, with reference made to relevant accompanying drawings.

FIG. 1(a) to FIG. 1(f) are cross-section views which illustrate the processes in manufacturing a printed circuit board according to the present invention.

Figure 1A:
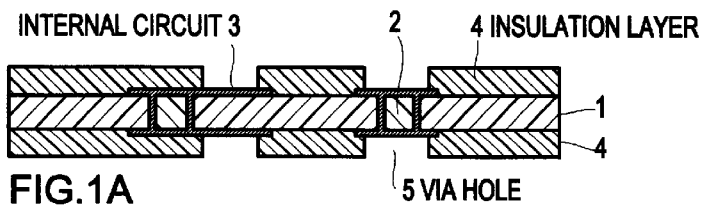
FIG. 1(a) to FIG. 1(f) are cross-section views showing the process steps in a method for manufacturing according to an embodiment of the present invention.
Figure 1B:
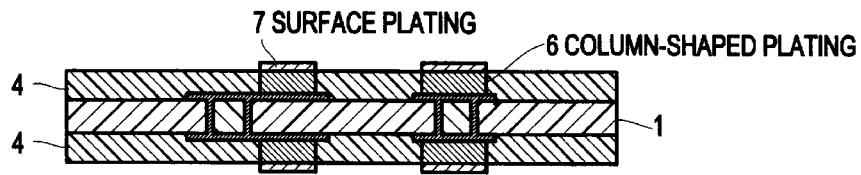

As shown in FIG. 1(a), a known method is used to manufacture a board 1, which is fabricated as a fiberglass-based epoxy resin laminate and which will serve as the core of the multilayer printed circuit board. In this board 1, a hole 2 filled with resin and an internal layer circuit 4 are formed. Then, an insulation layer 4 having a thickness of 40 to 80 $\mu$m, which is made from an organic insulating resin material, is formed on the surface of the board 1 using, for example, the curtain coating method, Next, a $CO_2$ laser or the like is used to form a via hole 5 having a diameter of 50 to 80 $\mu$m at required locations in the insulation layer 4.

Next, the board 1 is immersed in a desmearing liquid such as permanganic acid or a chromic acid solution. A typical desmearing process is one in which immersion is done into a solution of sodium hydroxide (10 to 20 g/l) and an organic additive (40 vol %) for 5 to 10 minutes, so as to cause swelling of the surface of the insulation layer 4. Then immersion is done in a solution of sodium permanganate (3 to 5 vol %) and sodium hydroxide (3 to 5 vol %) for 1 to 5 minutes, after which immersion is done in a solution of sulfuric acid (0.5 to 1 vol %) for 5 to 10 minutes to complete the desmearing.

After desmearing processing, the bottom conductor of the via hole 5 is activated by immersion into a solution of palladium chloride (0.5 to 1 g/l) for 5 to 10 minutes, after which electroless nickel plating is done until the inside of the via hole 5 is filled, thereby forming the column-shaped plating 6. In the electroless nickel plating, immersion is done in a solution of nickel sulfate (4 to 6 g/l), sodium hydrophosphite (20 to 40 g/l) and stabilizer (1 to 2 vol %) at 80 to 90° C. until the desired plating thickness is achieved.

Next, the surfaces of the insulation layer 4 and the column-shaped plating 6 are flattened by using a belt sander or the like. Finally, the surface of the insulation layer 4 is roughened, using for example permanganic acid or chromic acid, and is plated with a surface plating 7 of strike copper, electroless copper, flash gold, and thickening metal.

Figure 1C:
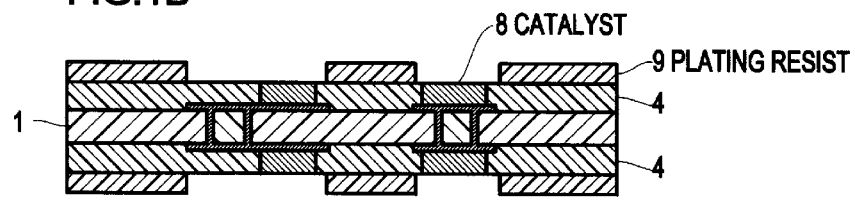

Next, as shown in FIG. 1(c), a catalyst 8 is applied to the surface of the surface plating 7 and patterning is done with a plating resist (photosensitive plating resist polymer) 9, after which the above-noted electroless nickel plating forms a nickel conductor 10, over which a surface plating 7 of, for example, strike copper, electroless copper, flash gold, thickening metal, and electroless solder is formed.

Figure 1D:
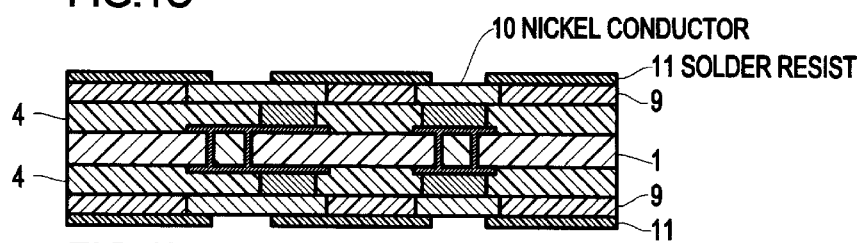

Then, as shown in FIG. 1(d), solder resist 11 is formed.

Figure 1E:
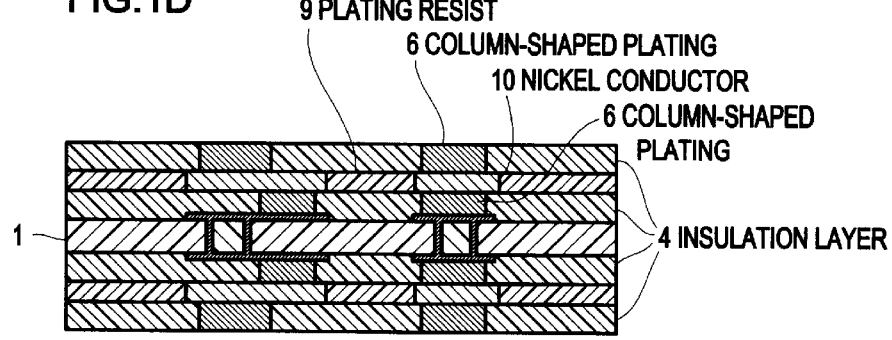

If the multilayer structure is to be extended further, as shown in FIG. 1(e), rather than forming the solder resist 11, an insulation layer 4, via hole 5, and column-shaped plating 6 are formed by the same type of processes described above, the surfaces of the insulation layer 4 and the column-shaped plating 6 being polished to flatten them and then roughened, thereby forming the surface plating 7.

Figure 1F:
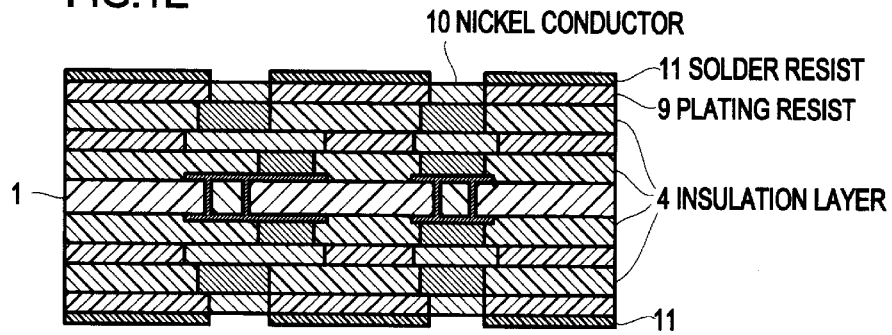
Figure 2:
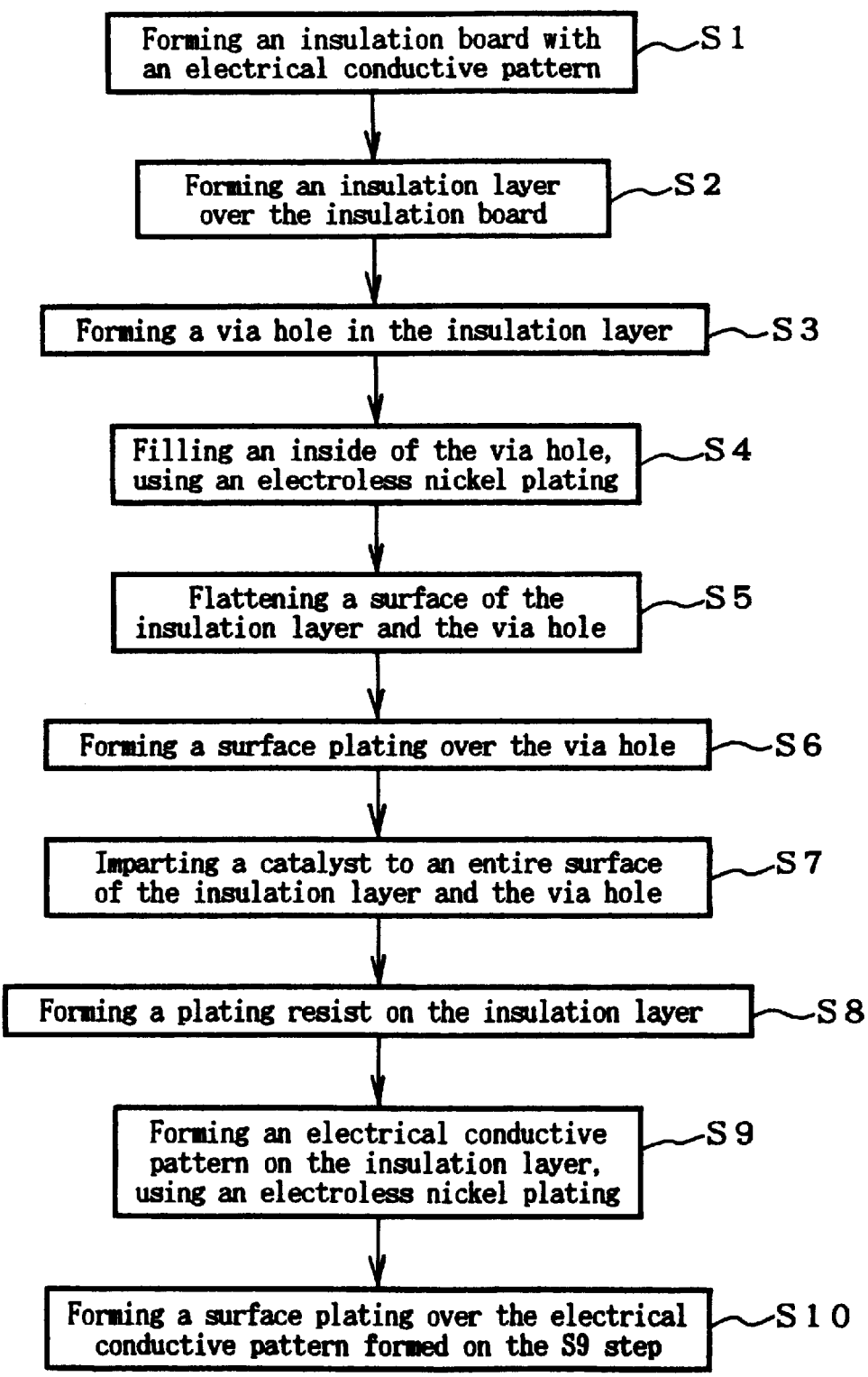
FIG. 2 is a flowchart of manufacturing a multilayer printed circuit board of the present invention.
Figure 3A:
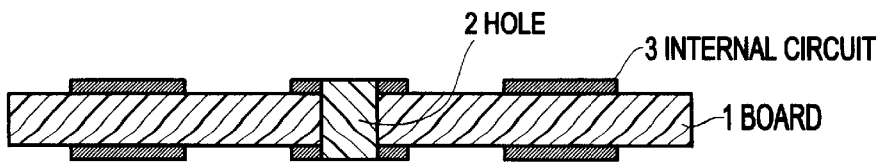
FIG. 3(a) to FIG. 3(f) are cross-section views showing the process steps in a method for manufacturing a printed circuit board according to the prior art.
Figure 3B:
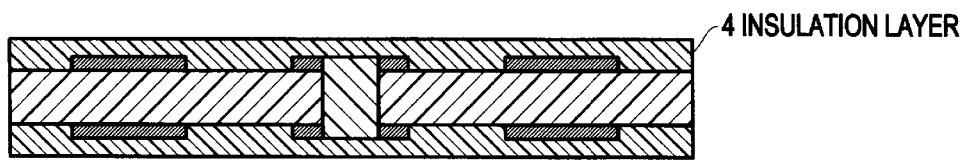
Figure 3C:
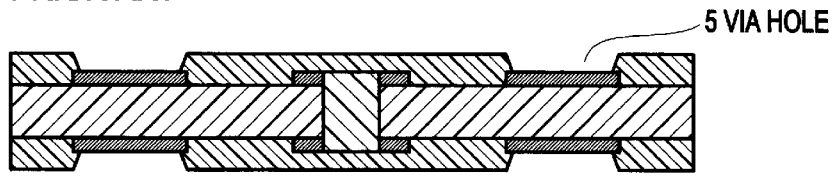
Figure 3D:
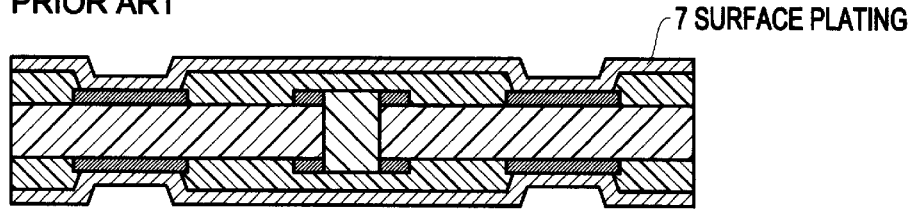
Figure 3E:
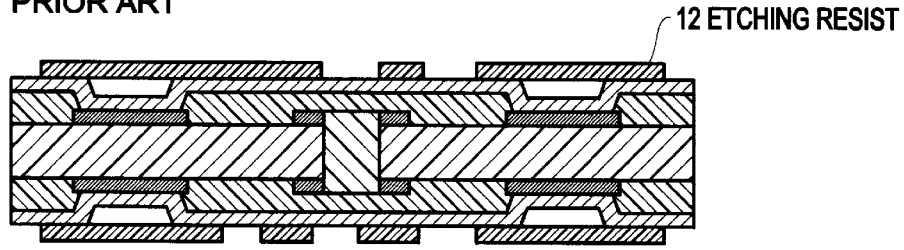
Figure 3F:
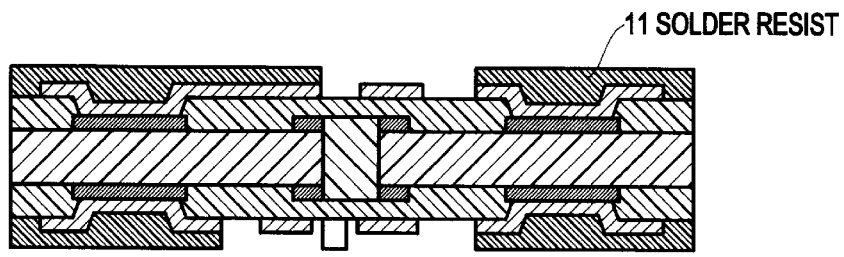
Figure 4A:
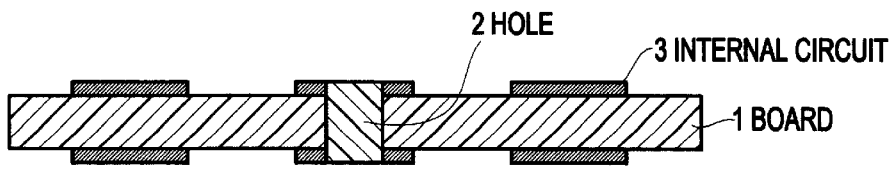
FIG. 4(a) to FIG. 4(f) are cross-section views showing the process steps in a method for manufacturing a printed circuit board according to the prior art.
Figure 4B:
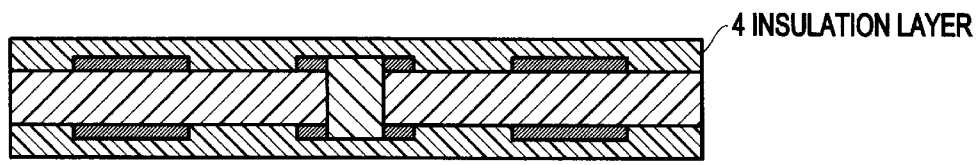
Figure 4C:
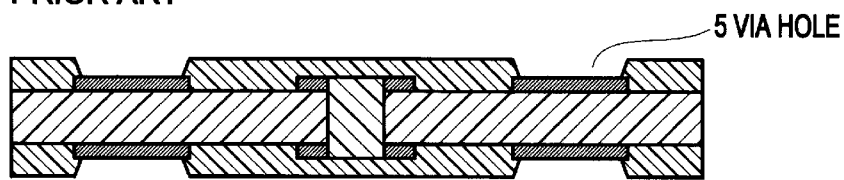
Figure 4D:
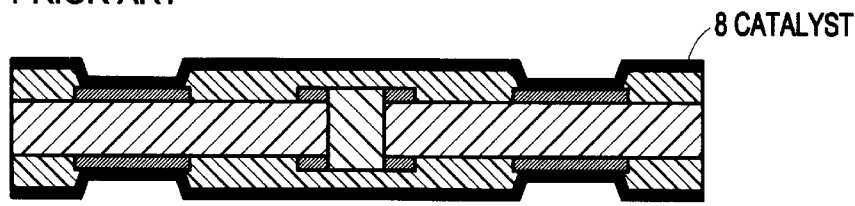
Figure 4E:
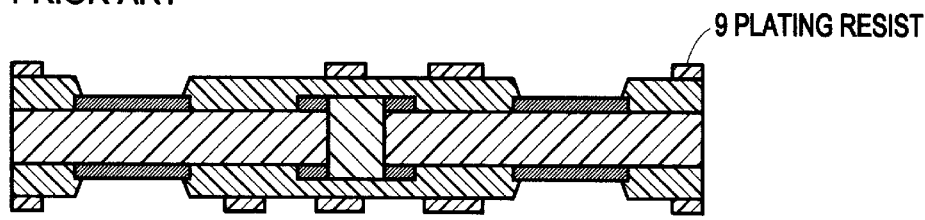
Figure 4F:
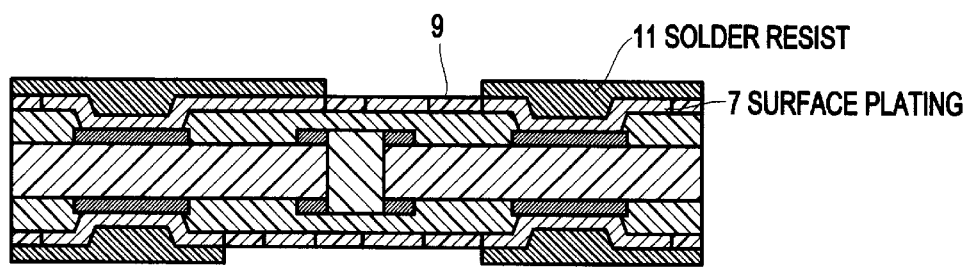

Additionally, as shown in FIG. 1(f), a catalyst is added and the plating resist 9, nickel conductor 10, and surface plating 7 are formed by the same type of processes, then solder resist 11 is formed. If the multilayer structure is to be extended further these process steps are repeated until the desired printed circuit board is achieved.

In the above embodiment, via holes are filled by an electroless nickel plating, however, by using an electroless copper plating instead of an electroless nickel plating, via holes can be filled.

By adopting the constitution described above, the present invention achieves the following effects.

Firstly, because the inside of the via hole of the present invention is filled with a nickel conductor, it is possible to form an electrically connected via hole at the same grid position, thereby removing the pattern design restriction imposed in the prior art.

Another effect is that, because the via hole is filled with a nickel conductor formed by electroless nickel plating, it is possible to obtain good plating attachment to a via hole, thereby improving the reliability of connections.

Another effect achieved by the filling of the via hole with a conductor is the elimination of fatigue of the via hole due to thermal cycling, thereby improving the connection reliability in comparison with via holes according to the prior art.

Another effect achieved by the present invention is that, because of the filling of the inside of the via holes with nickel and subsequent flattening, compared to the process of the past, there is an improvement in coplanarity, thereby enabling microfine wiring on a via hole.

Another effect achieved by the present invention is that, because the inside of the via holes are filled with a nickel conductor, the problem of poor adhesion between the copper plating and the insulation resin, which occurs in fabricating a multilayer printed circuit board having microfine wirings, is solved. As the conductive circuit is formed by electroless nickel plating, there is good adhesion to the insulation layer, and it is possible to achieve a high-quality plating with no gap with respect to the plating resist side wall, thereby enabling the achievement of microfine wiring of higher density than in the past.

Yet another effect achieved by the present invention is that by filling the inside of the via holes with a nickel conductor, which is then flattened, this can be used as a mounting pad.

Still another effect is that, because wiring is formed by nickel, it is possible to eliminate the nickel-gold plating step for bonding or soldering at the outermost layer.

What is claimed is:

1. A multilayer printed circuit board, comprising:
    an inner insulated board;
    a through hole that penetrates the inner insulated board;
    a first circuit layer formed on an upper surface and a lower surface of the inner insulated board, the first circuit layer on the upper surface being electrically connected to the first circuit layer on the lower surface by a conductive pathway located within the through hole penetrating the inner insulated board;
    an insulation layer formed on the inner insulated board and the first circuit layer;
    a via hole formed in the insulation layer and extending to the first circuit layer;
    a column-shaped plating formed in the via hole and comprised of a metallic conductor,
    wherein an outer surface of the column-shaped plating and an outer surface of the insulation layer are substantially flat; and
    a second circuit layer, which is formed on the insulation layer, that includes a pattern of plating resist and the metallic conductor.

2. A multilayer printed circuit board according to claim 1, wherein the metallic conductor comprises at least one of nickel and copper.

3. A multilayer printed circuit board according to claim 1, wherein the insulation layer is about 40 microns to about 80 microns in thickness.

4. A multilayer printed circuit board according to claim 1, wherein the via hole has a diameter of about 50 microns to about 80 microns.

5. A multilayer printed circuit board according to claim 1, wherein a two-layer structure is formed over the second circuit layer, the two-layer structure, comprising:
    an other insulation layer that includes another via hole, which penetrates the another insulation layer and contacts an underlying circuit layer, the another via hole being filled with an electroless plated metal that forms another column-shaped plating,
    wherein an outer surface of the two-layer structure, which includes the another insulation layer and the another column-shaped plating, is substantially flat; and
    another circuit layer formed directly on the outer surface of the layer of the two-layer structure.

6. A multilayer printed circuit board according to claim 5, wherein the another circuit layer includes the plating resist and the metallic conductor.

7. A multilayer printed circuit board according to claim 1, wherein the insulated board is made of a fiberglass-based epoxy resin laminate.

8. A multilayer printed circuit board according to claim 1, wherein the insulation layer is made of an organic insulating resin.

\* \* \* \* \*